(12) United States Patent
Chiu et al.

(10) Patent No.: US 12,224,227 B2
(45) Date of Patent: Feb. 11, 2025

(54) METHOD FOR MANUFACTURING SEMICONDUCTOR STRUCTURE WITH POWER CONNECTING STRUCTURES UNDER TRANSISTORS AND SEMICONDUCTOR STRUCTURE WITH POWER CONNECTING STRUCTURES UNDER TRANSISTORS

(71) Applicant: Tzu-Wei Chiu, Zhubei (TW)

(72) Inventors: Tzu-Wei Chiu, Zhubei (TW); Wei-Chih Chen, Zhubei (TW)

(73) Assignee: Tzu-Wei Chiu, Zhubei (TW)

( * ) Notice: Subject to any disclaimer, the term of this patent is extended or adjusted under 35 U.S.C. 154(b) by 219 days.

(21) Appl. No.: 17/746,997

(22) Filed: May 18, 2022

(65) Prior Publication Data
US 2022/0375825 A1 Nov. 24, 2022

(30) Foreign Application Priority Data

May 19, 2021 (TW) .................................. 110118108
Mar. 18, 2022 (TW) .................................. 111110115

(51) Int. Cl.
*H01L 23/48* (2006.01)
*H01L 21/463* (2006.01)
*H01L 21/768* (2006.01)
*H01L 21/8234* (2006.01)

(52) U.S. Cl.
CPC .......... *H01L 23/481* (2013.01); *H01L 21/463* (2013.01); *H01L 21/76873* (2013.01); *H01L 21/823475* (2013.01)

(58) Field of Classification Search
CPC . H01L 23/481; H01L 23/5286; H01L 21/743; H01L 21/76898
See application file for complete search history.

(56) References Cited

U.S. PATENT DOCUMENTS

| | | | |
|---|---|---|---|
| 9,780,210 B1 * | 10/2017 | Goktepeli | ............... H01L 21/84 |
| 2018/0061766 A1 * | 3/2018 | Goktepeli | ......... H01L 21/76895 |
| 2021/0336004 A1 * | 10/2021 | Huang | ............... H01L 23/5286 |
| 2021/0408247 A1 * | 12/2021 | Yu | ..................... H01L 29/66742 |
| 2023/0015572 A1 * | 1/2023 | Khaderbad | ....... H01L 21/28525 |

(Continued)

*Primary Examiner* — Erik Kielin

(57) ABSTRACT

A method for manufacturing a semiconductor structure with power connecting structures under transistors comprises: forming a stop layer structure in a semiconductor substrate to divide the semiconductor substrate into a first substrate part and a second substrate part; forming a plurality of stop portions in the first substrate part and in proximity to an active surface; arranging the transistor elements on the active surface, the contact portions of the transistor elements corresponding to the stop portions; removing the second substrate part and the stop layer structure; forming a first patterned mask layer with first patterned openings on a bottom surface of the first substrate part, the first patterned openings corresponding to the stop portions; forming through open slots in the first substrate part and exposing the contact portions via the open slots; forming a protecting layer to cover side walls of the open slots; forming a conductive layer to cover the contacts; and forming the power connecting structures in the open slots. The method has flexibility and can improve the device performance.

2 Claims, 12 Drawing Sheets

(56) References Cited

U.S. PATENT DOCUMENTS

| | | | |
|---|---|---|---|
| 2023/0260908 A1* | 8/2023 | Yeoh | H01L 29/42392 |
| | | | 257/347 |
| 2023/0352408 A1* | 11/2023 | Jung | H01L 29/78696 |
| 2024/0079239 A1* | 3/2024 | Wang | H01L 21/30625 |

* cited by examiner

METHOD FOR MANUFACTURING SEMICONDUCTOR STRUCTURE WITH POWER CONNECTING STRUCTURES UNDER TRANSISTORS AND SEMICONDUCTOR STRUCTURE WITH POWER CONNECTING STRUCTURES UNDER TRANSISTORS

FIELD OF THE INVENTION

The present invention relates to a semiconductor technology, and more particularly to a method for manufacturing a semiconductor structure with power connecting structures under transistors and a semiconductor structure with power connecting structures under transistors.

BACKGROUND OF THE INVENTION

Semiconductor industry experienced rapid growth as a result of improvement of integration density of various electronic elements (for example, transistors, diodes, resistors and capacitors). With increasing demand on miniature, higher speed, greater bandwidth, lower power consumption and lower delay, it is more complex for chip layout and more difficult to realize in production and manufacturing of semiconductor grains. For example, one of difficulties is gradually reduced routing areas.

At present, multi-gate electrode transistors are implemented to reduce the device size and increase the packaging density, resulting in challenge in design of power supplies and signal lines. Although existing source electrode/drain electrode contact structures have usually met their expected purposes, they are not satisfactory in all aspects.

SUMMARY OF THE INVENTION

The present invention provides a method for manufacturing a semiconductor structure with power connecting structures under transistors and the semiconductor structure with the power connecting structures under the transistors. The whole process is more flexible and can improve the device performance as well as improve the difficulty that the routing areas are decreased as a result of design in which the power connecting structures are directly formed under the transistors.

The method for manufacturing a semiconductor structure with power connecting structures under transistors provided by the present invention includes: providing a semiconductor substrate, the semiconductor substrate having an active surface and a back surface that are opposite; forming a stop layer structure in the semiconductor substrate to divide the semiconductor substrate into a first substrate part and a second substrate part, wherein the first substrate part is located between the stop layer structure and the active surface, and the second substrate part is located between the stop layer structure and the back surface; forming a patterned stop layer in the first substrate part and in proximity to the active surface, the patterned stop layers comprising a plurality of stop portions; arranging an active layer on the active surface, the active layer including transistor elements and an interconnection layer, the interconnection layer covering the transistor elements, each transistor element including a contact portion, and the contact portion corresponding to at least one of the stop portions; performing a thinning process to remove the second substrate part and the stop layer structure, wherein a bottom surface of the first substrate part is exposed and is located on a side opposite to the active surface; forming a first patterned mask layer on the bottom surface, the first patterned mask layer including a plurality of first patterned openings, the first patterned openings respectively corresponding to the stop portions; forming open slots in the first substrate part corresponding to the first patterned openings, the open slots passing through the first substrate part, each of the open slots including two opposite side walls and an open end, and exposing the contact portion of each transistor element of the active layer via the open end; forming a protecting layer to cover the bottom surface of the first substrate part and the two side walls of each of the open slots; forming a conductive layer to cover the contact portion exposed via the open slot; forming an electroplated seed layer to cover the protecting layer and the conductive layer; and forming power connecting structures respectively located on the electroplated seed layers of the open slots, wherein the power connecting structures respectively fill the open slots.

The semiconductor structure with power connecting structures under transistors provided by the present invention includes the substrate, the active layer, the stop portions, the protecting layer, the conductive layer, the electroplated seed layers and the power connecting structures. The substrate has an active surface and a bottom surface, the bottom surface is formed with the open slot, the open slot passes through the active surface, and the open slot includes two opposite side walls and an open end; the active layer is arranged on the active surface and includes transistor elements and an interconnection layer, the interconnection layer covers the transistor elements, each transistor element includes a contact portion, and the contact portion is exposed via the open end; the stop portions are respectively buried on the two side walls of the open slot and in proximity to the open end; the protecting layer is conformally arranged on the two side walls and the bottom surface; the conductive layer is arranged on the contact portion exposed via the open end; the electroplated seed layer conformally covers the part of protecting layer and the conductive layer located on the two side walls; and the power connecting structure fills the one open slot.

In an embodiment of the present invention, each transistor element includes a source electrode, a gate electrode and a drain electrode, the gate electrode is between the source electrode and the drain electrode, and the contact portion of the transistor element is arranged on at least one of the source electrode and the drain electrode.

In an embodiment of the present invention, the stop layer structure includes a first stop layer and a second stop layer that are stacked with each other, a material of the first stop layer is different from a material of the second stop layer, and the second stop layer is between the first stop layer and the second active layer.

In an embodiment of the present invention, the method of forming the patterned stop layer and the stop layer structure includes: performing a first ion implantation to a first depth of the semiconductor substrate from the active surface of the semiconductor substrate; performing a second ion implantation to a second depth of the semiconductor substrate from the active surface of the semiconductor substrate, the second depth being smaller than the first depth; forming a patterned photoresist layer on the active surface, and performing a third ion implantation on a third depth of the semiconductor substrate by taking the patterned photoresist layer as a mask, the third depth being smaller than the second depth; and removing the patterned photoresist layer and performing a high-temperature treatment process, wherein the first stop layer is formed in an area of the first ion implantation, the second stop layer is formed in an area of the second ion implantation, and the patterned stop layer is formed in an area of the third ion implantation.

In an embodiment of the present invention, a material of the first stop layer is silicon nitride, a material of the second stop layer is a silicon dioxide layer, and a material of the patterned stop layer is silicon nitride.

In an embodiment of the present invention, a thickness of the semiconductor substrate is between 700 microns and 800 microns, a distance between the stop layer structure and the active surface is between 30 nanometers and 200 nanometers, and a distance between the patterned stop layer and the active surface is between 5 nanometers and 20 nanometers.

In an embodiment of the present invention, the steps of performing a thinning process includes: a back grinding process: performing grinding from the back surface of the semiconductor substrate to remove a part of the second substrate part; a first removing step: removing the residual second substrate part; a second removing step: removing the first stop layer; and a third removing step: removing the second stop layer, wherein the first removing step, the second removing step and the third removing step are selected from one of chemical mechanical polishing and wet etching.

In an embodiment of the present invention, the steps of forming the open slots in the first substrate part includes: removing a part of the first substrate part by taking the first patterned mask layer as a mask so as to form a plurality of grooves, wherein the step portions are taken as etch stop layers; removing a part of each of the stop portions via the grooves by taking the first patterned mask layer as a mask so as to form a through slot in each of the stop portions; removing the first substrate part exposed via each of the through slots by taking the first patterned mask layer as a mask so as to form the open end; and removing the first patterned mask layer.

In an embodiment of the present invention, the part of the first substrate part is removed by a plasma etching process to form the grooves, a part of each of the stop portions is removed by a liner removing process to form the through slot, and the part of the first substrate part exposed via the through slot by a dry etching process.

In an embodiment of the present invention, the steps of forming the protecting layer includes: conformally forming a dielectric film to cover the bottom surface of the first substrate part, the two side walls of each of the open slots and the at least one contact portion exposed via the open end; forming a second patterned mask layer to cover the dielectric film, the second patterned mask layer comprising a plurality of second patterned openings, each of the second patterned openings corresponding to the part of the dielectric film contacted with the at least one contact portion; removing the part of the dielectric film exposed via the second patterned openings to expose the at least one contact portion; and removing the second patterned mask layer.

In an embodiment of the present invention, the steps of forming the conductive layer includes: conformally forming a metal film to cover the protecting layer and the at least one contact portion exposed via each of the open slots; performing an annealing process on the metal film, wherein the metal film forms a silicide layer; and leaving the other part of the silicide layer contacted with the at least one contact portion as the conductive layer while removing a part of the silicide layer located on the protecting layer.

In an embodiment of the present invention, the steps of forming the power connecting structures includes:

electroplating an electroplated layer to cover the electroplated seed layer, the electroplated seed layer at least filling each of the open slots; and removing a part of the electroplated layer and a part of electroplated seed layer located out of each of the open slots, wherein the part of the electroplated layer filling each of the open slots is taken as the power connecting structure.

By forming the step layer structure at a depth of the semiconductor substrate and performing subsequent thinning process gradually, the semiconductor substrate can be exactly polished or etched till an extremely thin first substrate part is retained. The power connecting structures are longitudinally connected to the source electrodes and/or drain electrodes of the transistor elements directly, so that the transistor elements can be powered or grounded via the backside (bottom surface) of the semiconductor substrate, and thus, the difficulty that the routing areas are reduced is improved. Furthermore, the longitudinal length of the power connecting structures can be adjusted according to the thickness of the retained first substrate part, so that the whole process is more flexible and can improve the device performance.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
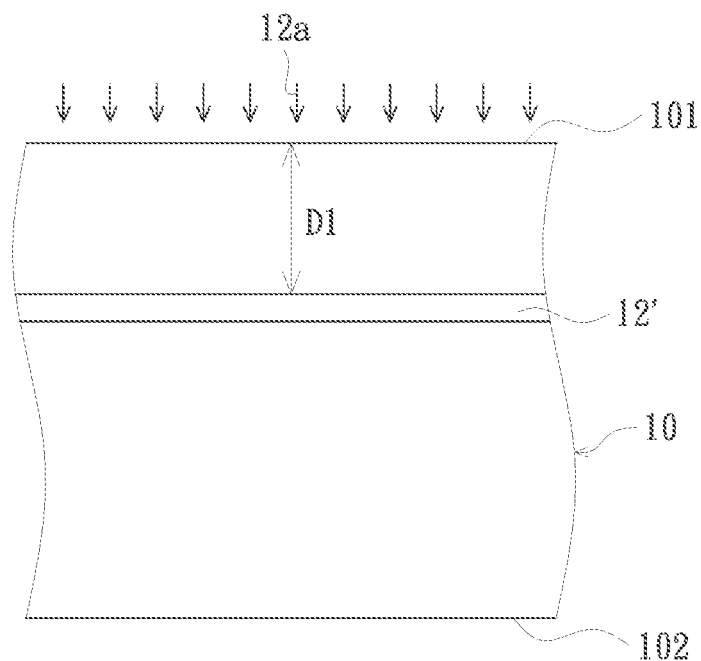
FIG. 1A to FIG. 1R are schematic cross-sectional views of a method for manufacturing a semiconductor structure with power connecting structures under transistors, according to an embodiment of the present invention.
Figure 1B:
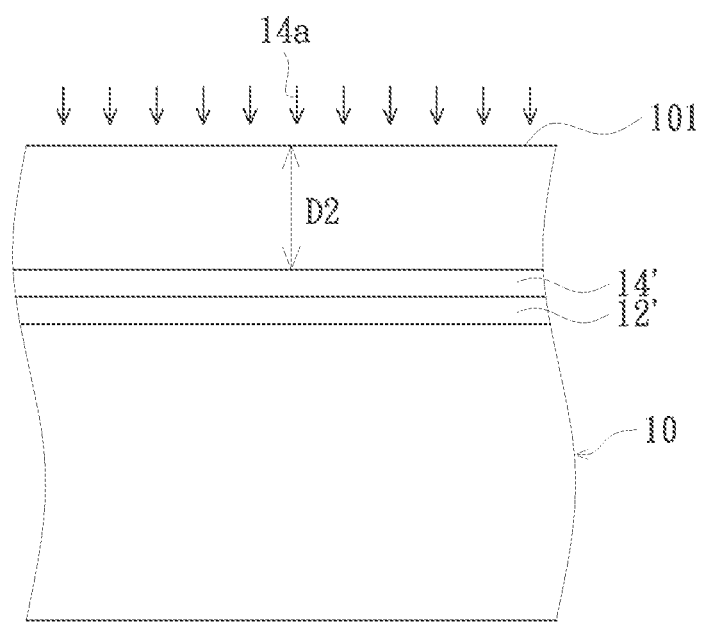
Figure 1C:
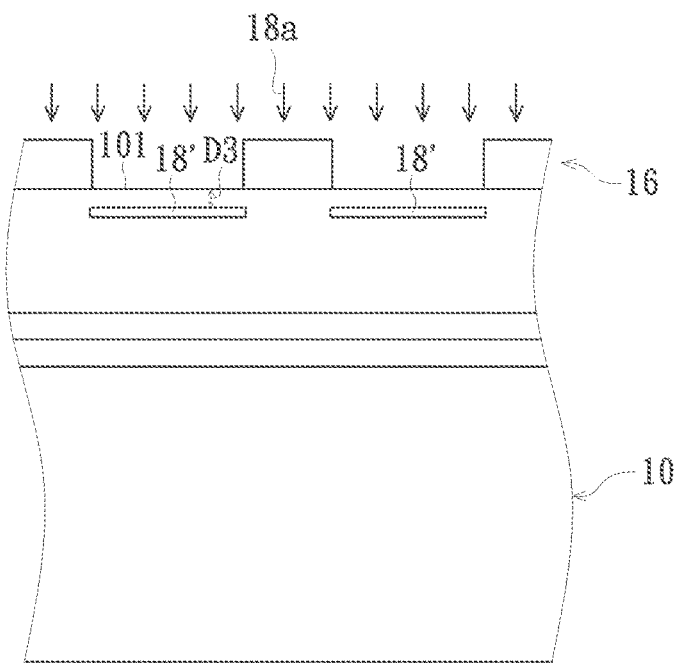
Figure 1D:
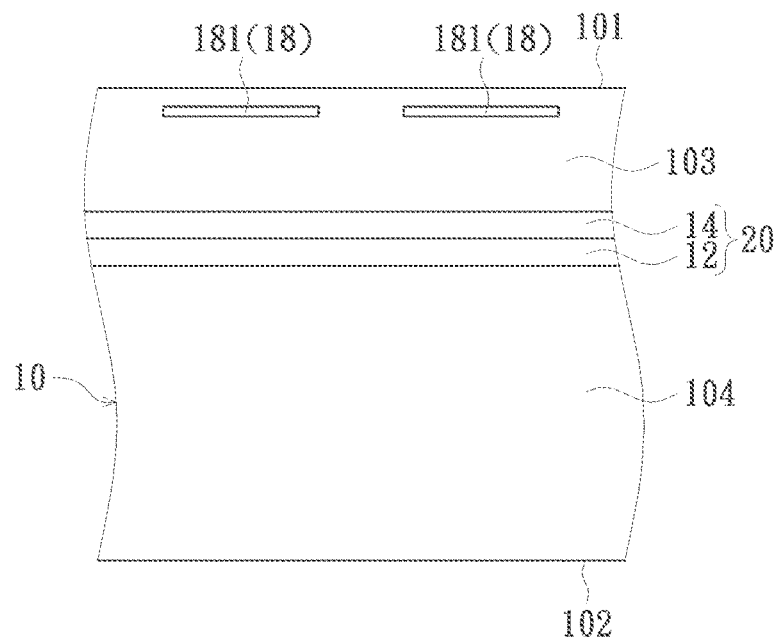
Figure 1E:
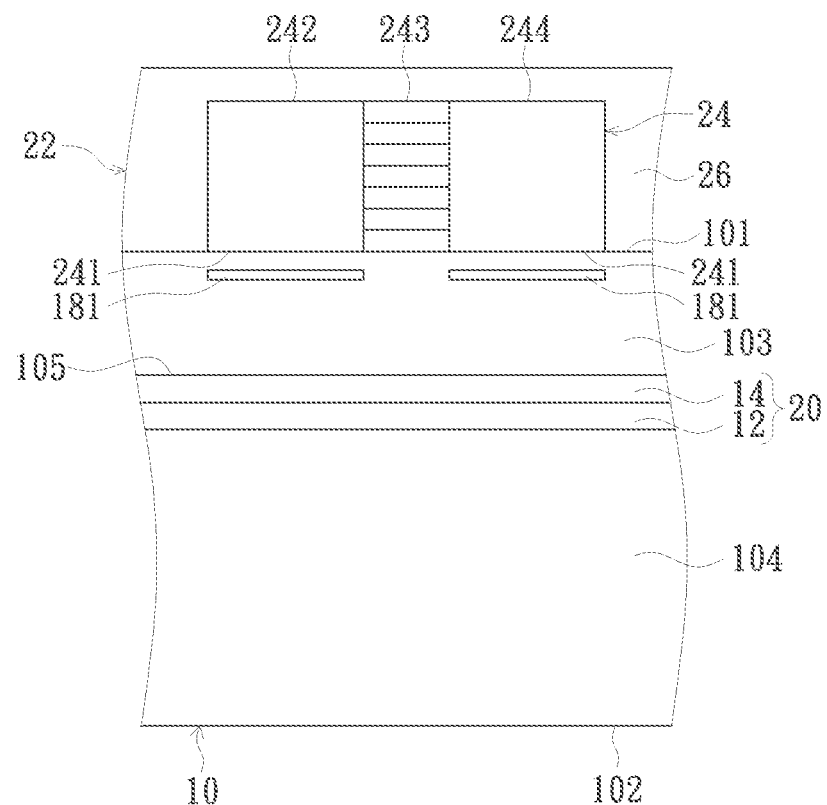
Figure 1F:
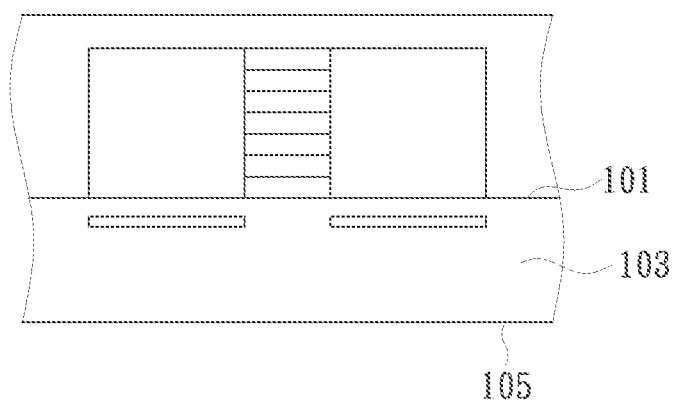
Figure 1G:
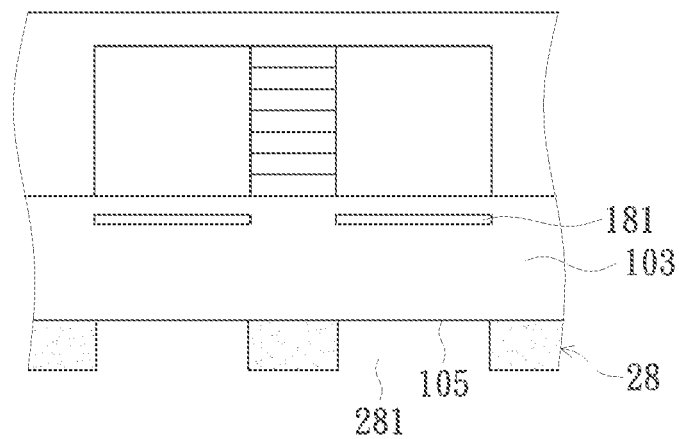
Figure 1H:
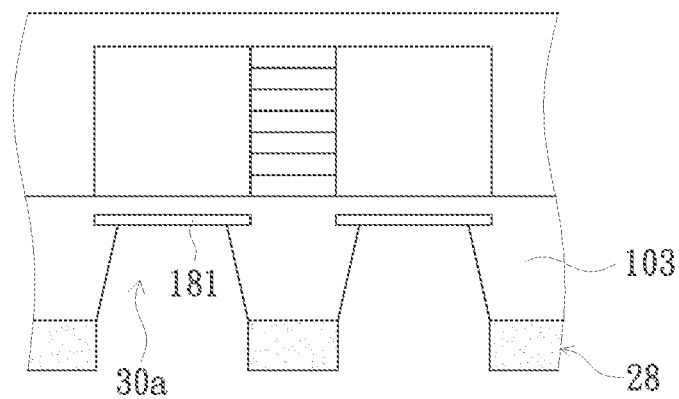
Figure 1I:
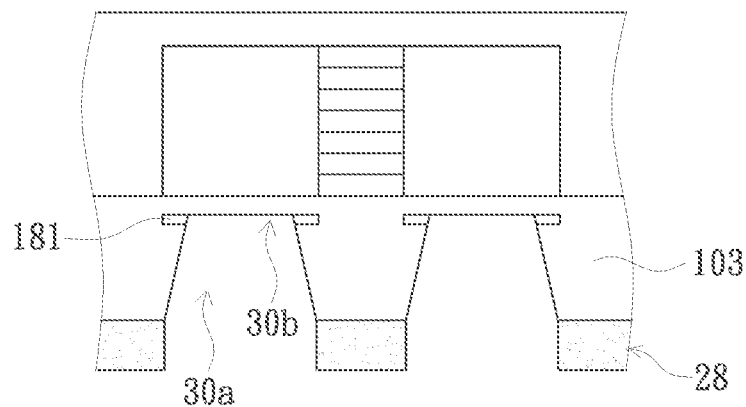
Figure 1J:
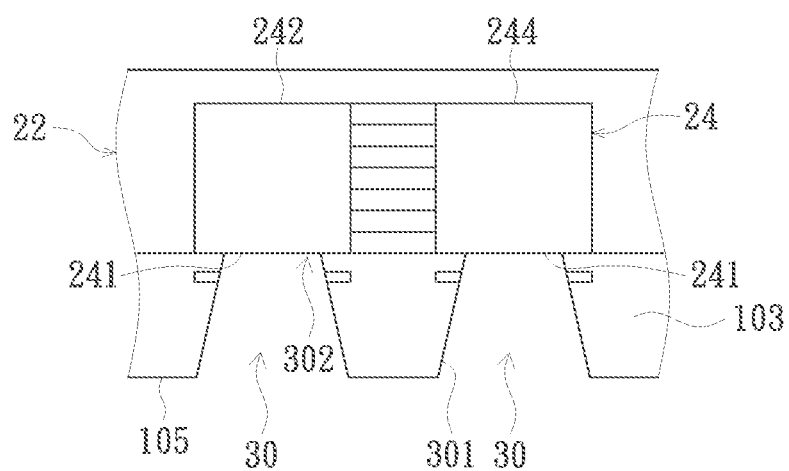
Figure 1K:
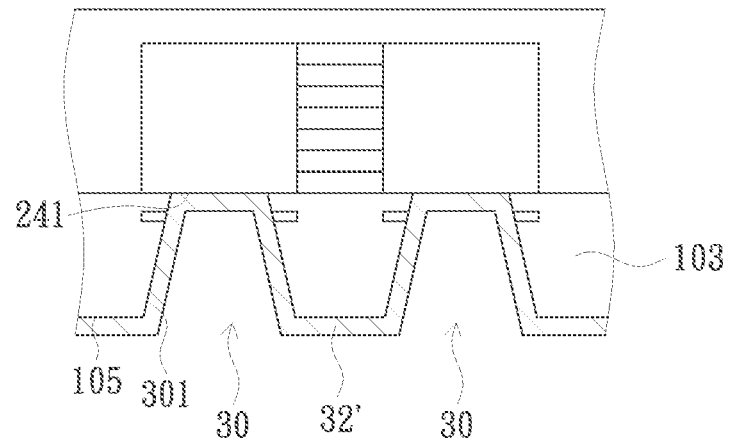
Figure 1L:
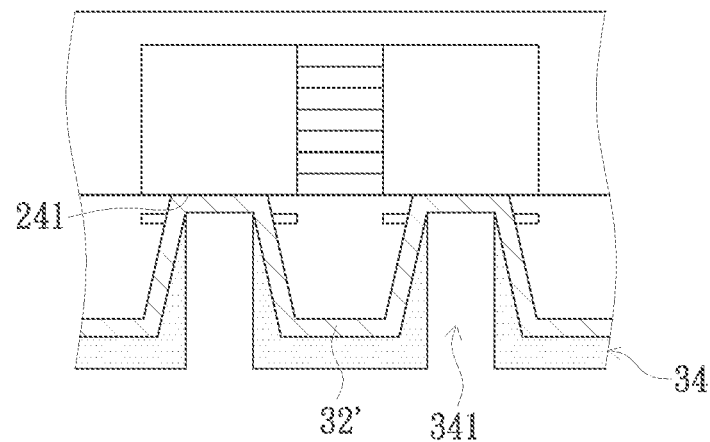
Figure 1M:
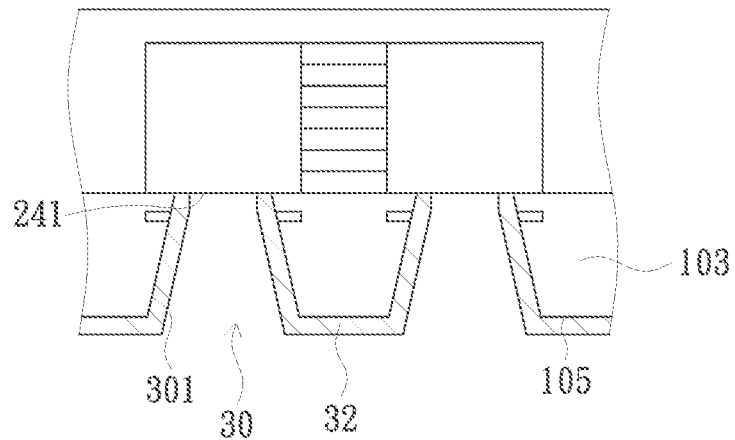
Figure 1N:
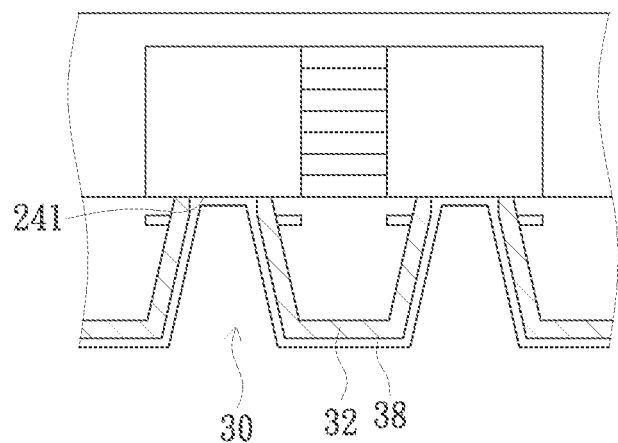
Figure 1O:
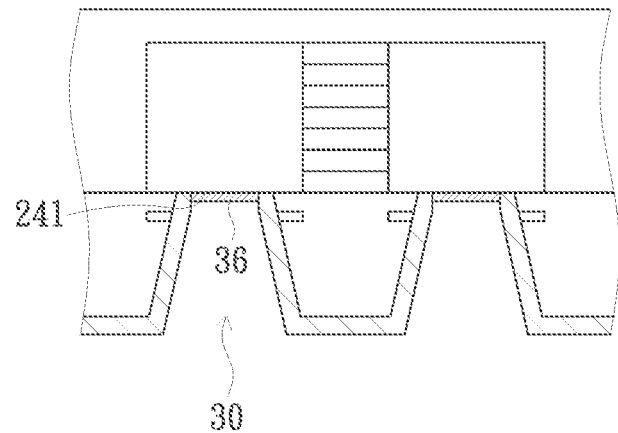
Figure 1P:
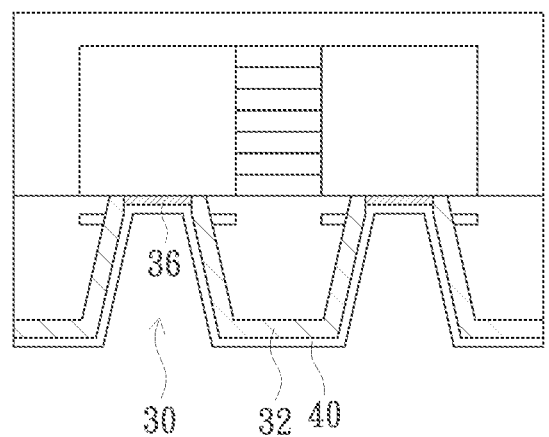
Figure 1Q:
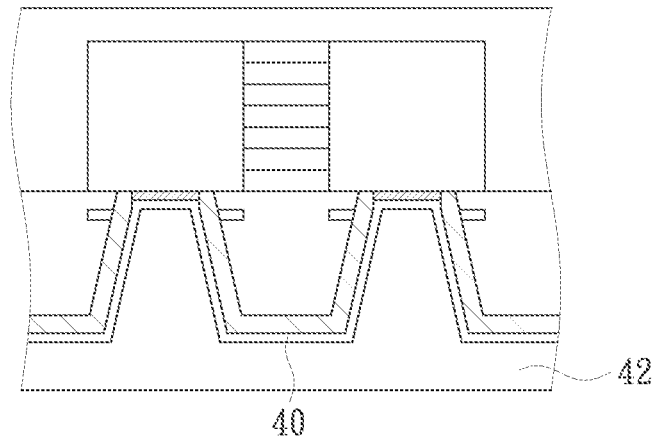
Figure 1R:
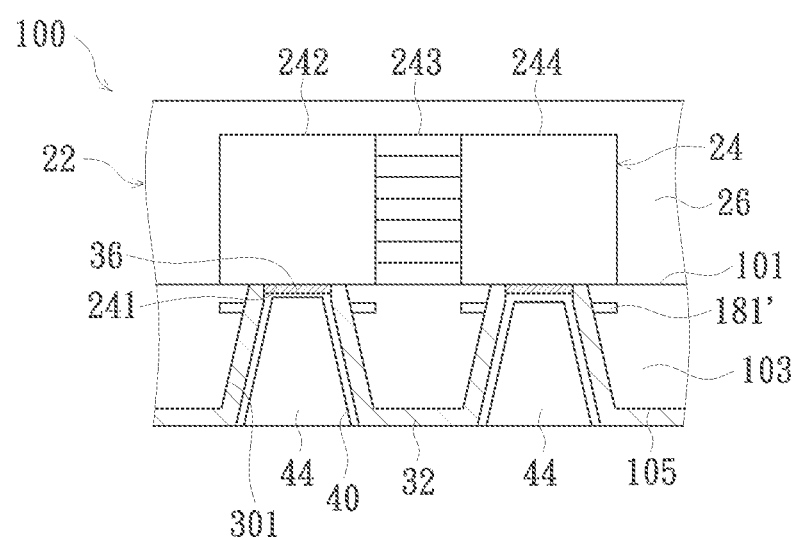

FIG. 1A to FIG. 1R are schematic cross-sectional views of a method for manufacturing a semiconductor structure with power connecting structures under transistors, according to an embodiment of the present invention. As shown in FIG. 1A, a semiconductor substrate 10 is provided. For example, a silicon substrate, an epitaxial silicon substrate, a silicon germanium substrate, a silicon carbide substrate or a silicon on insulation (SOI) substrate are provided. In an embodiment, a thickness of the semiconductor substrate 10 is, for example, 700 um to 800 um, preferably 775 um. The semiconductor substrate 10 has an active surface 101 and a back surface 102 that are opposite.

As shown in FIG. 1D, a stop layer structure 20 is formed in the semiconductor substrate 10 to divide the semiconductor substrate 10 into a first substrate part 103 and a second substrate part 104, wherein the semiconductor substrate 10 between the stop layer structure 20 and the active surface 101 is called the first substrate part 103, and the semiconductor substrate 10 between the stop layer structure 20 and the back surface 102 is called the second substrate part 104. Further, the patterned stop layer 18 is formed in the first substrate part 103 and is in further proximity to the active surface 101. The patterned stop layer 18 includes a plurality of stop portions 181. In an embodiment, the stop layer structure 20 includes a first stop layer 12 and a second stop layer 14 that are stacked with each other, a material of the first stop layer 12 is different from a material of the second stop layer 14, and the second stop layer 14 is between the first stop layer 12 and the active surface 101. In an embodiment, a distance between the stop layer structure 20 and the active surface 101 is between 30 nanometers and 200 nanometers, and a distance between the patterned stop layer 18 and the active surface 101 is between 5 nanometers and 20 nanometers; further, thicknesses of the first stop layer 12 and the second stop layer 14 are, for example, 300 nanometers, a thickness of the stop portion 181 is, for example, about 10 nanometers, and a width of the stop portion 181 is, for example, about 50 nanometers.

Further referring to FIG. 1A to FIG. 1D, in an embodiment, the method of forming the stop layer structure 20 and the patterned stop layer structure 18 includes: first, performing a first ion implantation 12a to a first depth D1 of the semiconductor substrate 10 from the active surface 101 to form a first ion implantation area 12', as shown in FIG. 1A; then, performing a second ion implantation 14a to a second depth D2 of the semiconductor substrate 10 from the active surface 101 to form a second ion implantation area 14', as shown in FIG. 1B, the second depth D2 of the second ion implantation area 14' being smaller than the first depth D1 of the first ion implantation area 12'; then, as shown in FIG. 1C, forming a patterned photoresist layer 16 on the active surface 101, and performing a third ion implantation 18a on a third depth D3 of the semiconductor substrate 10 by taking the patterned photoresist layer 16 as a mask to form a third ion implantation area 18', the third depth D3 being smaller than the second depth D2 and the third ion implantation area 18' in extreme proximity to the active surface 101; and removing the patterned photoresist layer 16 and performing a high-temperature treatment process, as shown in FIG. 1D, wherein the first stop layer 12 is formed in the first ion implantation area 12', the second stop layer 14 is formed in the second ion implantation area 14', and the patterned stop layer 18 is formed in the third ion implantation area 18'.

The first ion implantation 12a is, for example, nitrogen ion implantation; the first stop layer 12 is, for example, a silicon nitride ($Si_3N_4$) layer; the second ion implantation 14a is, for example, oxygen ion implantation; the second stop layer 14 is, for example, a silicon dioxide ($SiO_2$) layer; the third ion implantation 18a is, for example, nitrogen ion implantation; and a material of the patterned stop layer 18 is silicon nitride.

Continuing the above description, the active layer 22 is arranged on the active surface 101, as shown in FIG. 1E. The active layer 22 includes transistor elements 24 (only one transistor elements 24 is shown in the figure, but not limited to) and an interconnection layer 26, the interconnection layer 26 covering the transistor elements 24 and the transistor elements 24 including a contact portion 241. In the embodiment, each transistor element 24 includes a source electrode 242, a gate electrode 243 and a drain electrode 244. The gate electrode 243 is between the gate electrode 243 and the drain electrode 244. The contact portion 241 of each transistor element 24 is arranged on at least one of the source electrode 242 and the drain electrode 244. In the embodiment as shown in FIG. 1E, the transistor element 24 is horizontally arranged on the active surface 101. Both the source electrode 242 and the drain electrode 244 of the transistor element 24 are contacted with the active surface 101. A part where one of the source electrode 242 and the drain electrode 244 contacts with the active surface 101 is, for example, taken as the contact portion 241 of the transistor element 24. As shown in FIG. 1E, each contact portion 241 corresponds to each stop portion 181.

Then, a thinning process is performed to remove the second portion 104 of the substrate and the stop layer structure 20, so that the first portion 103 of the substrate is exposed outside the bottom surface 105, as shown in FIG. 1F. The bottom surface 105 is located on an opposite side of the active surface 101. In an embodiment, the steps of performing a thinning process includes: a back grinding process: performing grinding from the back surface 102 of the semiconductor substrate 10 to remove a part of the second substrate part 104 and leave the extremely thin second substrate part 104; a first removing step: removing the residual second substrate part 104; a second removing step: removing the first stop layer 12; and a third removing step: removing the second stop layer 14, wherein the first removing step, the second removing step and the third removing step are selected from one of chemical mechanical polishing (CMP) and wet etching.

To be more specific, when the material of the first stop layer 12 is silicon nitride, and the material of the second stop layer 14 is silicon oxide, the first removing step is a first chemical mechanical polishing process, wherein a selection ratio of silicon and silicon nitride is, for example, 20, that is, $Si/Si_3N_4$ is 20; the second removing step is a second chemical mechanical polishing process to remove the first stop layer 12 so as to expose the second stop layer 14, wherein a selection ratio of silicon nitride and silicon dioxide is, for example, 10, that is, $Si_3N_4/SiO_2$ is 10; and the third removing step is a third chemical mechanical polishing process to remove the second stop layer 14 so as to expose the bottom surface 105 of the first substrate part 103, wherein a selection ratio of silicon dioxide and silicon is, for example, 5, that is, $SiO_2/Si$ is 5.

Then, as shown in FIG. 1G, the first patterned mask layer 28 is formed on the bottom surface 105, the first patterned mask layer 28 includes a plurality of first patterned openings 281, and the first patterned openings 281 respectively correspond to the stop portions 181. In an embodiment, the first patterned mask layer 28 is, for example, a patterned photoresist layer. Then, corresponding to the first patterned openings 281, a plurality of open slots 30 (as shown in a subsequent FIG. 1J) are formed in the first substrate part 103. Each of the open slots 30 includes two opposite side walls 301 and an open end 302. The contact portion 241 of the transistor element 24 is exposed via the open end 302, for example, the contact portion 241 of the source electrode 242 and the drain electrode 244 is exposed.

In an embodiment, the steps of forming the open slots 30, as shown in FIG. 1H to FIG. 1J, includes: first, a part of the first substrate part 103 is removed by taking the first patterned mask layer 28 as a mask so as to form a plurality of grooves 30a, as shown in FIG. 1H, wherein the step portions 181 are taken as etch stop layers; in an embodiment, the part of first substrate part 103 is removed by a plasma etching process so as to form grooves 30a; then, a part of the stop layers 181 exposed via the grooves 30a is removed by taking the first patterned mask layer 28 as a mask, as shown in FIG. 1I so as to form through slots 30b in the stop portions 181; in an embodiment, a part of the stop portions 181 is removed by a liner remove process so as to form through slots 30b; then, the part of first substrate part 103 exposed via each through slot 30b is removed by taking the first patterned mask layer 28 as a mask, as shown in FIG. 1J so as to form an open end 302; in an embodiment, the part of first substrate part 103 exposed via the through slot 30b is removed by a wet type etching process; and then, the first patterned mask layer 28 is removed; in an embodiment, the first patterned mask layer 28 is removed by an ash process.

Then, the protecting layer 32 (as shown in a subsequent FIG. 1M) is formed to cover the bottom surface 105 of the first substrate part 103 and two side walls 301 of each open slot 30, wherein the protecting layer 32 does not cover the contact portion 241, and the contact portion 241 is still exposed via the open slot 30. In an embodiment, the steps of forming the protecting layer 32 are as shown in FIG. 1K to FIG. 1M. A dielectric film 32' is conformally formed first, as shown in FIG. 1K. The dielectric film 32' covers the bottom surface 105 of the first substrate part 103, the two side walls 301 of each first open slot 30 and the contact portion 241 exposed via the open end 302 (marked in FIG. 1J). In an embodiment, the dielectric film 32' is formed by a plasma-enhanced atomic layer deposition (PEALD) process; then, as shown in FIG. 1L, the second patterned mask layer 34 is formed to cover the dielectric film 32', the second patterned mask layer 34 includes a plurality of second patterned openings 341, and each of the second patterned openings 341 corresponds to the part of dielectric film 32' contacted with the contact portion 241; then, as shown in FIG. 1M, the part of dielectric film 32' exposed via the second patterned openings 341 is removed so as to expose the contact portion 241. In an embodiment, the part of dielectric film 32' is removed by the wet type etching process; then, the second patterned mask layer 34 is further removed; and Then, the conductive layer 36 is formed to cover the contact portion 241 exposed via each of the open slots 30. In an embodiment, the steps of forming the conductive layer 36 are as shown in FIG. 1N to FIG. 1O. The metal film 38 is conformally formed first, as shown in FIG. 1N. The metal film 38 covers the protecting layer 32 and the contact portion 241 exposed via the open end 302 (marked in FIG. 1J). In an embodiment, the metal film 38 is formed by a metal sputtering deposition process (MSD), and a proper metal film 38 is, for example, a titanium (Ti) film, a tantalum (Ta) film, a nickel (Ni) film, a cobalt (Co) film or a wolfram (W) film; and then, an annealing process is performed on the metal film 38 to cause silicification between the metal film 38 and the contact portion 241 so as to form a silicide layer. A material of the silicide is, for example, titanium silicide (TiSi), titanium silicon nitride (TiSiN), tantalum silicide (TaSi), wolfram silicide (WSi), cobalt silicide (CoSi) or nickel silicide (NiSi); as shown in FIG. 1O, a part of silicide layer located on the protecting layer 32 is removed and the other part contacted with the contact portion 241 is left as the conductive layer 36.

Then, as shown in FIG. 1P, the electroplated seed layer 40 is formed to conformally cover the protecting layer 32 and the conductive layer 36. In an embodiment, the electroplated seed layer 40 is, for example, formed by way of sputtering. Then, as shown in FIG. 1Q, the electroplated layer 42 is formed by an electroplating process to cover the electroplated seed layer 40 and fills the open slot 30 (marked in FIG. 1P); then, the part of the electroplated layer 42 and the part of the electroplated seed layer 40 located outside each of the open slots 30 are removed, as shown in FIG. 1R, and only the electroplated layer 42 and the electroplated seed layer 40 in the open slot 30 are left, and the electroplated layer 42 filling the open slot 30 is taken as the power connection structure 44. The power connection structure 44 is the source electrode 242 and/or the drain electrode 244 corresponding to the transistor element 24. In an embodiment, the height of the power connection structure 44 is between 50 nanometers and 200 nanometers.

Continuing the above description, as shown in FIG. 1R, the semiconductor structure 100 with power connecting structures under transistors in an embodiment of the present invention includes a substrate (the first substrate part 103, accordingly), an active layer 22, stop portions 181', a protecting layer 32, a conductive layer 36, an electroplated seed layer 40 and the power connection structures 44. The active layer 22 is arranged on the active surface 101 and includes the transistor elements 24 and the interconnection layer 26, the interconnection layer 26 covers the transistor elements 24, each transistor element 24 includes the source electrode 242, the gate electrode 243 and the drain electrode 244, and the gate electrode 243 is between the source electrode 242 and the drain electrode 244. The bottom surface 105 of the substrate (the first substrate part 103, accordingly) is formed with the open slots 30 (marked in FIG. 1J), each of the open slots 30 is provided with two side walls 301 and an open end 302 (marked in FIG. 1J), and the contact portion 241 of the source electrode 242 and/or the drain electrode 244 of the transistor element 24 is exposed via the open end 302. Each of the stop portions 181' is buried between the two side walls 301 of the open slot 30 and is in proximity to the open end 302. The protecting layer 32 is arranged on the two side walls 301 and the bottom surface 105 of the open slot 30. The conductive layer 36 is arranged on the contact portion 241 exposed via the open end 302. The electroplated seed layer 40 conformally covers the protecting layer 32 on the side walls 301 and the conductive layer 36. The power connection structure 44 fills each of the open slots 30.

Figure 2:
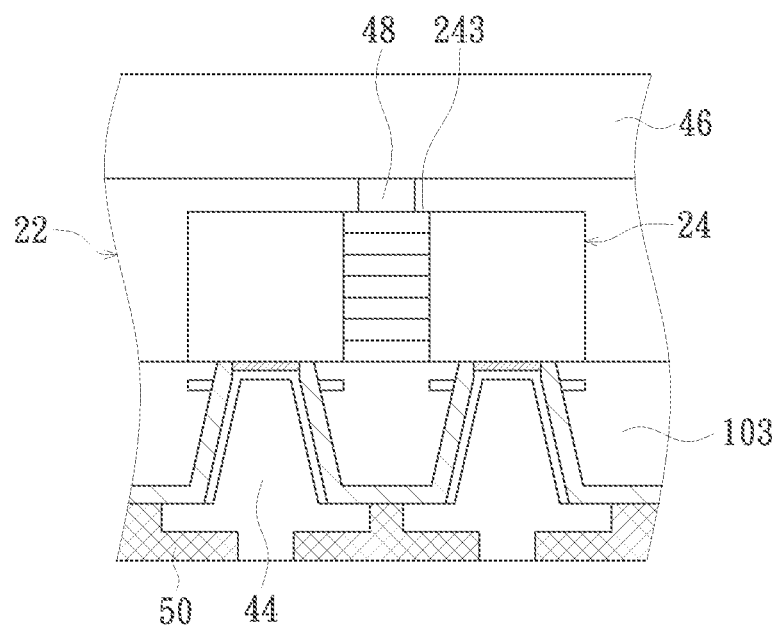
FIG. 2 is a schematic diagram of an application of a semiconductor structure with power connecting structures under transistors, according to an embodiment of the present invention.

FIG. 2 is an application schematic diagram of a semiconductor structure with power connection structures under transistors, according to an embodiment of the present invention. As shown in FIG. 2, the active layer 22 is provided with a redistribution layer 46 which is formed with, for example, a metal route, a metal pillar (via) and a micro-bump. The gate electrode 243 of the transistor element 24 is electrically connected with the redistribution layer 46 via, for example, a conductive contact 48. Furthermore, an interconnection layer 50 is arranged below the substrate (the first substrate part 103, accordingly) and the power connection structure 44 protrudes out of the open slot 30 (marked in FIG. 1J) and passes through the interconnection layer 50. In an undrawn embodiment, another redistribution layer can further be arranged below the interconnection layer 50, and a side of the redistribution layer far away from the interconnection layer 50 is provided with, for example, a solder ball, so as to electrically connect the power connection structure 44 and the solder ball by utilizing the redistribution layer.

Figure 3:
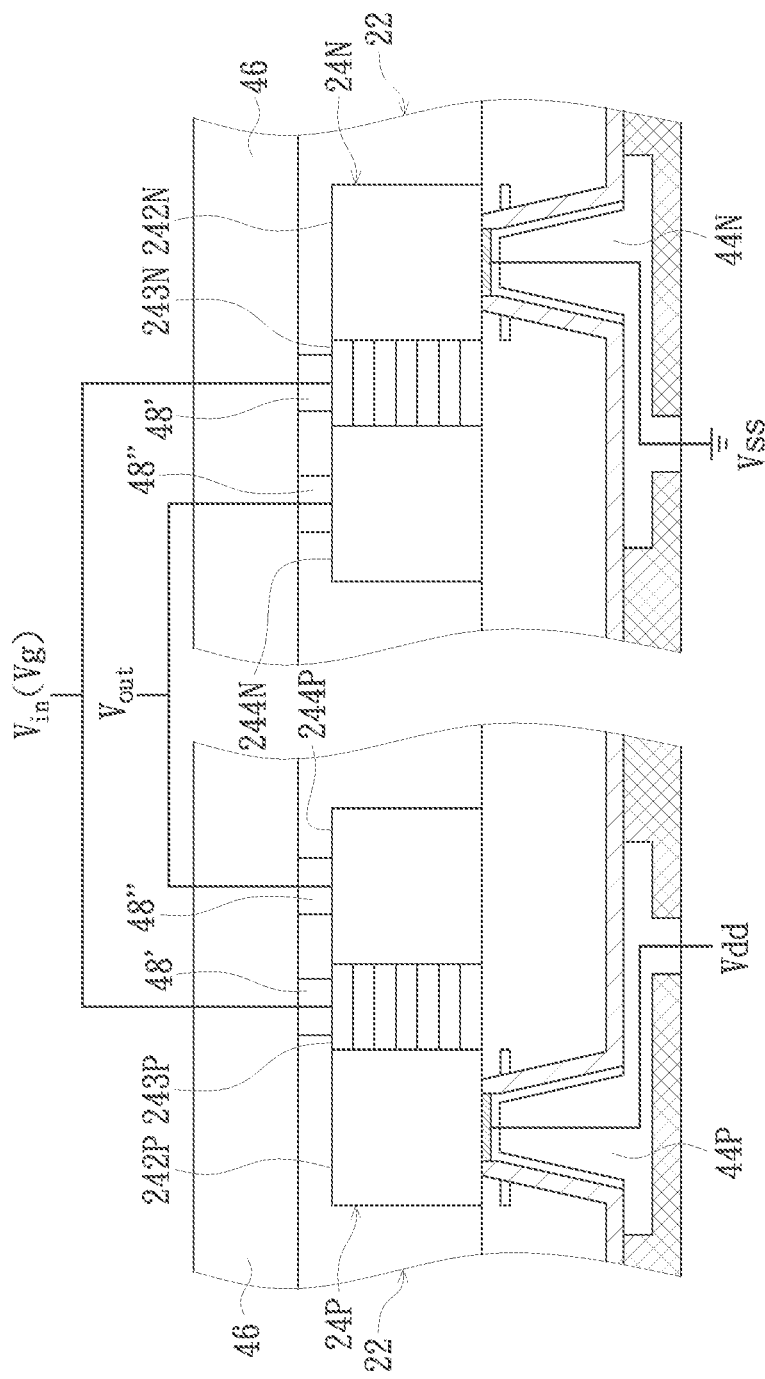
FIG. 3 is another schematic diagram of an application of a semiconductor structure with power connecting structures under transistors, according to an embodiment of the present invention.

FIG. 3 is another application schematic diagram of a semiconductor structure with power connection structures under transistors, according to an embodiment of the present invention. As shown in FIG. 3, the semiconductor structure with power connection structures under transistors is applied in an inverter, wherein the active layer 22 is provided with a P-type transistor (PMOS)24P and an N-type transistor (NMOS)24N. A power connection structure 44P contacted below the source electrode 242P of the PMOS 24P is coupled to a voltage source Vdd, and a power connection structure 44N contacted below the source electrode 242N of the NMOS 24N is coupled to a ground terminal Vss. The active layer 22 is further provided with the redistribution layer 46, wherein conductive contacts 48' are respectively formed between a gate electrode 243P of the PMOS 24P and the redistribution layer 46 and between a gate electrode 243N of the NMOS 24N and the redistribution layer 46, and the conductive contacts 48' are electrically connected with the gate electrodes 243P/243N and the redistribution layer 46 so as to electrically connect the gate electrode 243P of the PMOS 24P and the gate electrode 243N of the NMOS 24N to an input voltage end Vin via the redistribution layer 46; furthermore, conductive contacts 48" are respectively formed between a drain electrode 244P of the PMOS 24P and the redistribution layer 46 and between a drain electrode 244N of the NMOS 24N and the redistribution layer, and the conductive contacts 48" are electrically connected with the drain electrodes 244P/244N and the redistribution layer 46 so as to electrically connect the drain electrode 244P of the PMOS 24P and the drain electrode 244N of the NMOS 24N to an output voltage end Vout via the redistribution layer 46.

Figure 4:
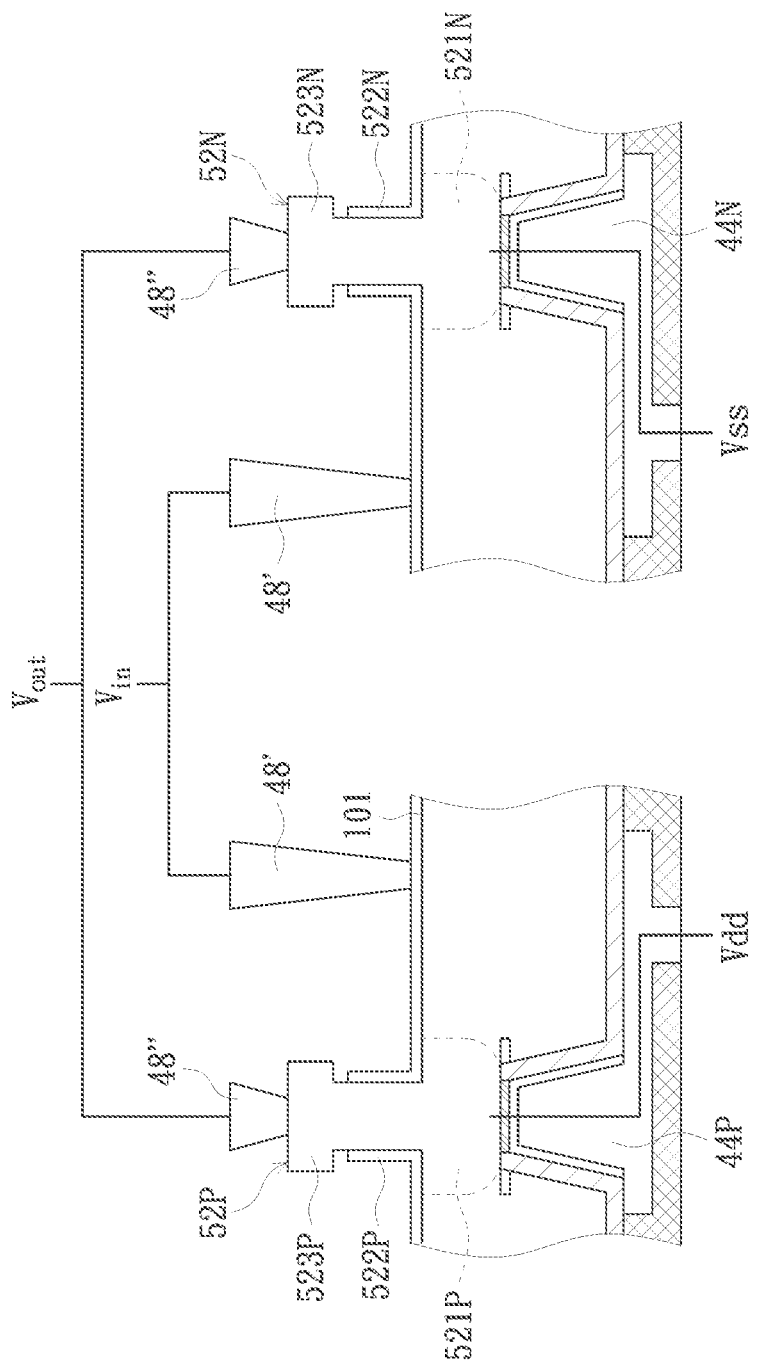
FIG. 4 is another schematic diagram of an application of a semiconductor structure with power connecting structures under transistors, according to an embodiment of the present invention.

FIG. 4 is another application schematic diagram of a semiconductor structure with power connection structures under transistors, according to an embodiment of the present invention. As shown in FIG. 4, the semiconductor structure with power connection structures under transistors is applied in an inverter, wherein the active surface 101 is provided with a P-type vertical transmission field effect transistor 52P (P-type VTFET) and an N-type VTFET 52N. As shown in FIG. 4, a source electrode 521P of the P-type VTFET 52P and a source electrode 521N of the N-type VTFET 52N are respectively contacted with the power connection structure 44P and the power connection structure 44N, wherein the power connection structure 44P contacted with the source electrode 521P of the P-type VTFET 52P is coupled to a voltage source Vdd, and the power connection structure 44N contacted with the source electrode 521N of the N-type VTFET 52N is coupled to a ground terminal Vss; a gate electrode 522P of the P-type VTFET 52P and a gate electrode 522N of the N-type VTFET 52N are electrically connected to an input voltage end Vin via the conductive contacts 48', and a drain electrode 523P of the P-type VTFET 52P and a drain electrode 523N of the N-type VTFET 52N are electrically connected to a voltage end Vout via the conductive contacts 48".

In a method for manufacturing the semiconductor structure with power connection structures under transistors in an embodiment of the present invention, the semiconductor substrate can be exactly polished or etched till the first substrate part is retained, namely, an extremely small substrate thickness of 30-200 nanometers is retained by forming of the stop layer structure at a depth of the semiconductor substrate and gradual progress of the subsequent thinning process. In addition, the power connection structures are longitudinally connected with the source electrode and/or the drain electrode of the transistor element directly, so that the transistor element can be powered or grounded via the backside (the bottom surface) of the semiconductor substrate, and therefore, the difficulty that the routing areas are reduced is improved. Furthermore, the longitudinal lengths of the power connection structures can be adjusted according to the thickness of the retained first substrate part, so that the whole process is more flexible and can improve the device performance.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A semiconductor structure with power connecting structures under transistors, comprising:
   a substrate having an active surface and a bottom surface, the bottom surface being formed with at least one open slot, the at least one open slot passing through the active surface, and the at least one open slot comprising two opposite side walls and an open end;
   an active layer arranged on the active surface and connected with the open end, the active layer comprising at least one transistor element and an interconnection layer, the interconnection layer covering the at least one transistor element, the at least one transistor element comprising at least one contact portion, and the at least one contact portion being exposed via the open end;
   a plurality of stop portions respectively buried in the substrate, connected with the two side walls of the at least one open slot and in proximity to the open end;
   a protecting layer conformally arranged on the two side walls and the bottom surface;
   at least one conductive layer arranged on the at least one contact portion exposed via the open end;
   an electroplating seed layer conformally covering the part of protecting layer and the at least one conductive layer located on the two side walls; and
   at least one power connecting structure filling the at least one open slot.
2. The semiconductor structure with power connecting structures under transistors according to claim 1, wherein a distance between the stop portion and the active surface is between 5 nanometers and 20 nanometers, and a material of the stop portion is silicon nitride.

* * * * *